(12) United States Patent
Chen et al.

(10) Patent No.: US 8,237,055 B2
(45) Date of Patent: Aug. 7, 2012

(54) CIRCUIT BOARD

(75) Inventors: Wang-Jia Chen, Shenzhen (CN); Wei Zhou, Shenzhen (CN); Yu-Hsu Lin, San Jose, CA (US); Feng Zhang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 490 days.

(21) Appl. No.: 12/564,734

(22) Filed: Sep. 22, 2009

(65) Prior Publication Data

US 2010/0307795 A1 Dec. 9, 2010

(30) Foreign Application Priority Data

Jun. 5, 2009 (CN) .......................... 2009 1 0302951

(51) Int. Cl.
*H05K 1/00* (2006.01)

(52) U.S. Cl. ..................................................... 174/250
(58) Field of Classification Search ................ None
See application file for complete search history.

(56) References Cited

U.S. PATENT DOCUMENTS

| | | | | |
|---|---|---|---|---|
| 6,477,060 | B1 * | 11/2002 | Peter et al. | 361/795 |
| 7,019,959 | B2 * | 3/2006 | Chua | 361/329 |
| 2003/0042044 | A1 * | 3/2003 | Kirk | 174/255 |
| 2004/0124493 | A1 * | 7/2004 | Chua | 257/508 |
| 2006/0240594 | A1 * | 10/2006 | Fraley et al. | 438/107 |
| 2011/0110052 | A1 * | 5/2011 | Ohmi et al. | 361/748 |

* cited by examiner

*Primary Examiner* — Gregory Thompson
(74) *Attorney, Agent, or Firm* — Altis Law Group, Inc.

(57) ABSTRACT

A circuit board includes an insulation layer, a signal layer disposed on one side of the insulation layer, and a ground plane and a power plane disposed on the insulation layer at a side opposite to the signal layer. The insulation layer forms a separating area arranged between the ground plane and the power plane. At least two signal traces parallel to each other are arranged on the signal layer at one side corresponding to one of the ground plane and the power plane. A width of the signal trace close to the separating area is wider than that of the signal trace away from the separating area.

7 Claims, 2 Drawing Sheets

CIRCUIT BOARD

BACKGROUND

1. Technical Field

The present disclosure relates to circuit boards, and particularly to a circuit board capable of providing good signal quality.

2. Description of Related Art

Circuit boards, such as printed circuit boards (PCBs), are widely used in electronic devices. In designing a PCB, controlling trace impedance is very important. The trace impedance is determined by a number of parameters, such as the widths of the signal traces, distances between adjacent signal traces, and the thicknesses of insulation layers of the PCB. If the parameters are improperly set, the signal traces will have uneven impedance. Uneven impedances may affect the signal quality of the PCB.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
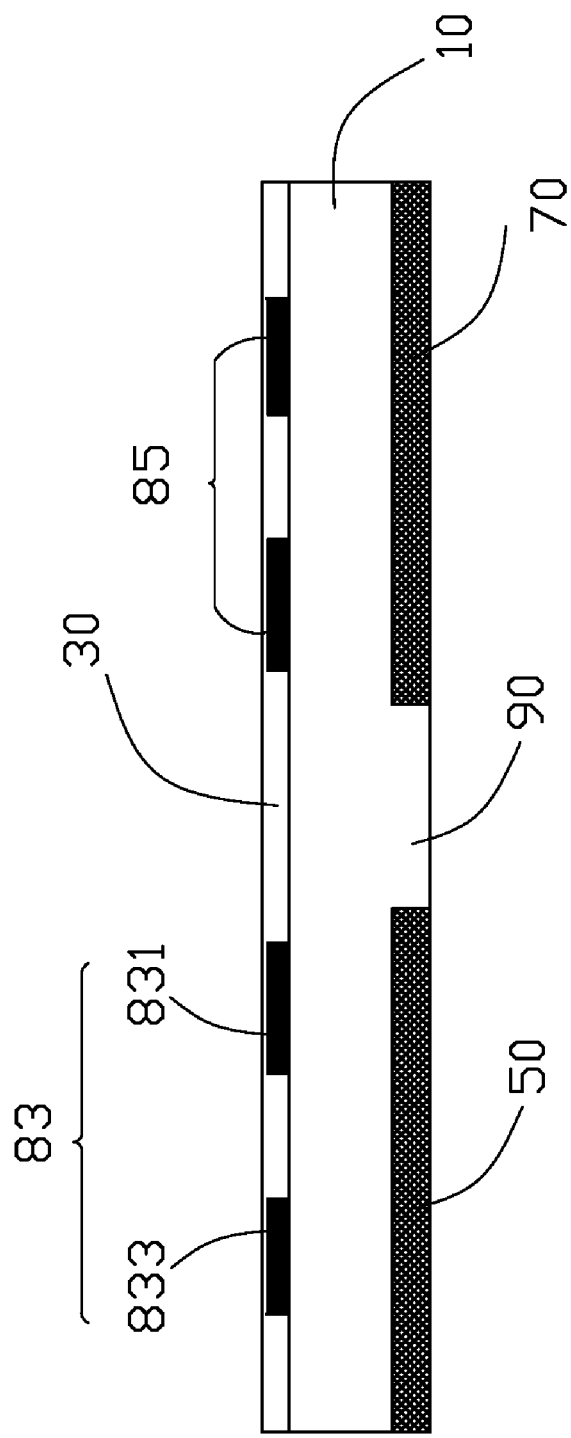
FIG. 1 is a cross-sectional view of an embodiment of a circuit board.
Figure 2:
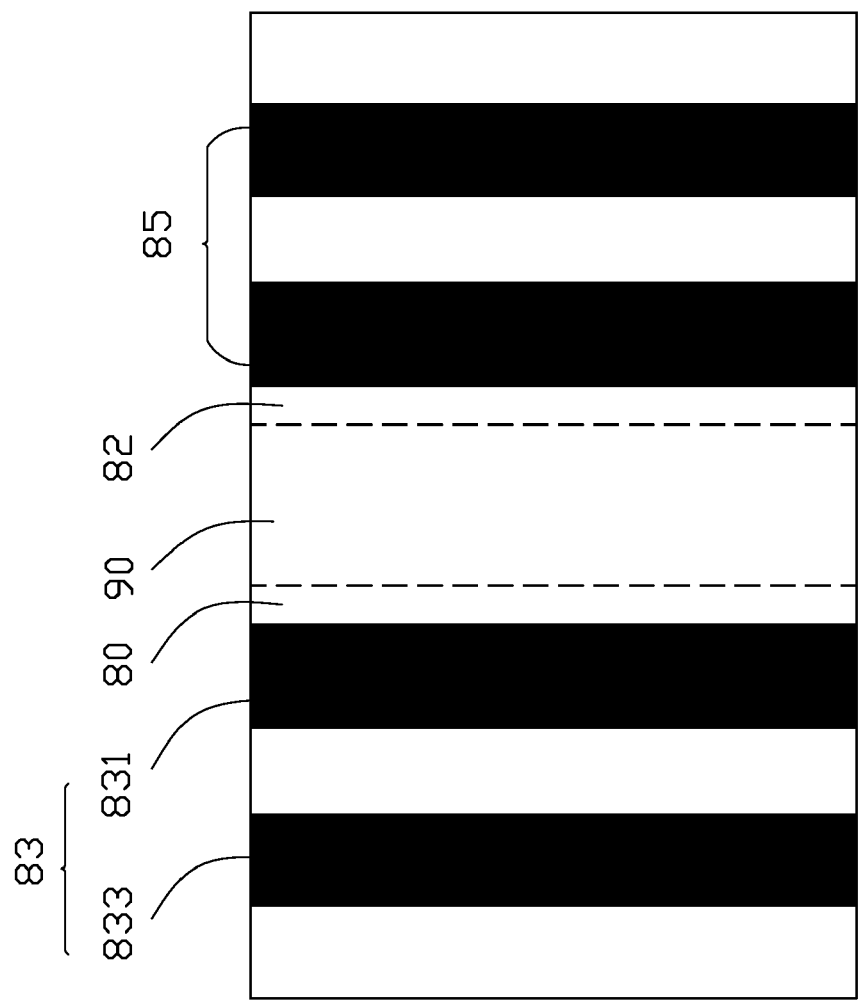
FIG. 2 is a top view of the circuit board of FIG. 1.

Referring to FIGS. 1 and 2, an embodiment of a circuit board includes an insulation layer 10, a signal layer 30 disposed on one side of the insulation layer 10, a ground plane 50 and a power plane 70 disposed on the insulation layer 10 at a side opposite to the signal layer 30. An insulation layer separating area 90 is formed between the ground plane 50 and the power plane 70. The signal layer 30 defines a first area 80 corresponding to the ground plane 50 and a second area 82 corresponding to the power plane 70. A first group of signal traces 83 is arranged on the first area 80, and a second group of signal traces 85 is arranged on the second area 82. The first group of signal traces 83 includes a first signal trace 831 close to the separating area 90, and a second signal trace 833 away from the separating area 90. A width of the first signal trace 831 is greater than a width of the second signal trace 833.

In a first embodiment, the first group of signal traces 83 is illustrated to indicate impedance variety of the circuit board signal traces. For instance, the width of the second signal trace 833 away from the separating area 90 may be set as 9 mil. The width of the first signal trace 831 close to the separating area 90 may be set as 9 mil, 9.5 mil, 10 mil, or 10.5 mil. It should be understood that the measurements disclosed here, are by way of example, and are not intended to limit the disclosure.

The separating area 90 has a side contacting the ground plane 50, and the first signal trace 831 has a side adjacent to and parallel to the separating area side. Generally, when a distance between the first signal trace side and the separating area side is greater than twice the thickness of the insulation layer, the separating area 90 will have little effect on the impedance of the first signal trace 831. When the first signal trace 831 is closer to the separating area 90, the first signal trace impedance increases. Therefore, the distance between the first signal trace side and the separating area side may be set to 0 mil, as an example, to indicate the relationship between the signal trace width and impedance. It may be understood that circuit boards typically have a distance between a side of the signal trace close to the separating area 90 and the separating area side can be greater than zero but less than twice the thickness of the insulation layer.

A simulation is performed according to the above conditions to get impedance of the signal traces 831 and 833. In the results, the impedance of the second signal trace 833 is 45 ohms. The impedance of the first signal trace 831 with different widths is shown in the following table 1:

TABLE 1

| Signal trace width (mil) | Impedance (ohm) | Impedance deviation (ohm) |
|---|---|---|
| 9 | 48.9 | 3.9 |
| 9.5 | 47.4 | 2.4 |
| 10 | 46.1 | 1.1 |
| 10.5 | 45.3 | 0.3 |

From the above table 1, it can be seen that when the width of the first signal trace 831 is 9 mil, which is the same as the width of the second signal trace 833, the impedance deviation between the signal traces 831 and 833 is great, so that the signal quality will be greatly affected. When the width of the first signal trace 831 is 10.5 mil, the impedance deviation between the signal traces 831 and 833 is much smaller, and signal transmitting characteristics of the signal traces 831 and 833 will remain consistent to improve signal quality of the circuit board. Therefore, when the width of the first signal trace 831 close to the separating area 90 is 17% greater than that of the second signal trace 833 away from the separating area 90, the signal quality will not be affected by the separating area 90.

Because impedance of the first signal trace 831 will becomes lower when the distance between the first signal trace 831 and the separating area 90 is greater than zero, in a general condition, the minimum width of the first signal trace 831 close to the separating area 90 can be set as 15% greater than that of the second signal trace 833 away from the separating area 90.

In a second embodiment, a simulation was performed with the width of the second signal trace 833 away from the separating area 90 set at 5 mil. A width of the first signal trace 831 close to the separating area 90 is set as 5 mil, 5.5 mil, 6 mil, or 6.5 mil. The other conditions are set as the same as the first embodiment. In the results, impedance of the second signal trace 833 is 59.1 ohm. Impedance of the first signal trace 831 with different widths is shown in the following table 2:

TABLE 2

| Signal trace width (mil) | Impedance (ohm) | Impedance deviation (ohm) |
|---|---|---|
| 5 | 65.6 | 6.5 |
| 5.5 | 62.8 | 3.7 |
| 6 | 60.2 | 1.1 |
| 6.5 | 58.0 | −1.1 |

From the above table 2, it can be seen that when the width of the first signal trace 831 is 5 mil, which is the same as that of the second signal trace 833, the impedance deviation between the signal traces 831 and 833 is much great, so that the signal quality will be greatly affected. When the width of first signal trace 831 is from 6 mil to 6.5 mil, the impedance deviation between the signal traces 831 and 83 will be decreased to a minimize value. Signal transmitting characteristic of the signal traces 831 and 833 will remain consistent to improve signal quality of the circuit board. Therefore, when the width of the first signal trace 831 close to the separating area 90 is 20% or 23% greater than that of the second signal trace 833 away from the separating area 90, the signal quality will not be affected by the separating area 90.

Comparing the table 2 with the table 1, when the width of the signal traces 831 is equal to that of the signal trace 833, the width is smaller, the impedance deviation between the two signal traces is greater. Therefore, for general conditions, a maximum width value of the first signal trace 831 close to the separating area 90 can be set as 25% greater than the second signal trace 833 away from the separating area 90.

According to the above embodiments, when the width of the first signal trace 831 close to the separating area 90 is greater than 115% of the width of the second signal trace 833 away from the separating area 90, but less than 125%, the impedance of the signal traces 831 and 833 will remain substantially consistent, and the signal quality will not be affected by the separating area 90.

It is to be understood, however, that even though numerous characteristics and advantages of the embodiments have been set forth in the foregoing description, together with details of the structure and function of the present disclosure, the disclosure is illustrative only, and changes may be made in detail, especially in matters of shape, size, and arrangement of parts within the principles of the embodiments to the full extent indicated by the broad general meaning of the terms in which the appended claims are expressed.

What is claimed is:

1. A circuit board, comprising:
   an insulation layer;
   a signal layer disposed on one side of the insulation layer; and
   a ground plane and a power plane disposed on the insulation layer at a side opposite to the signal layer, a separating area formed between the ground plane and the power plane; wherein at least two signal traces parallel to each other are arranged on the signal layer at one side corresponding to one of the ground plane and the power plane, and a width of the signal trace close to the separating area is wider than a width of the signal trace away from the separating area.

2. The circuit board of claim 1, wherein the signal layer defines a first area corresponding to the ground plane and a second area corresponding to the power plane, the at least two signal traces are arranged on one of the first area and the second area.

3. The circuit board of claim 1, wherein a width of the signal trace close to the separating area is greater than a 115% width of the signal trace away from the separating area, but smaller than a 125% width of the signal trace away from the separating area.

4. The circuit board of claim 1, wherein a width of the signal trace away from the separating area is 9 mil; a width of the signal trace close to the separating area is greater or equal to 10 mil, but smaller or equal to 10.5 mil.

5. The circuit board of claim 1, wherein a width of the signal trace away from the separating area is 5 mil; a width of the signal trace close to the separating area is greater than or equal to 6 mil, but smaller than or equal to 6.5 mil.

6. The circuit board of claim 1, wherein the signal trace close to the separating area has a side adjacent to the separating area, and the separating area has a side adjacent to the signal trace, a distance between the signal trace side and the separating area side is smaller than double thickness of the insulation layer.

7. The circuit board of claim 2, wherein the signal layer comprises two groups of signal traces arranged thereon, and one group of signal traces are disposed on the first area, and the other group signal traces are disposed on the second area.

* * * * *